United States Patent [19]
Jayaraman

[11] Patent Number: 5,513,204
[45] Date of Patent: Apr. 30, 1996

[54] LONG WAVELENGTH, VERTICAL CAVITY SURFACE EMITTING LASER WITH VERTICALLY INTEGRATED OPTICAL PUMP

[75] Inventor: Vijaysekhar Jayaraman, Santa Barbara, Calif.

[73] Assignee: Optical Concepts, Inc., Lompoc, Calif.

[21] Appl. No.: 422,486

[22] Filed: Apr. 12, 1995

[51] Int. Cl.$^6$ .............................. H01S 3/19; H01S 3/094
[52] U.S. Cl. ................................. 372/96; 372/50; 372/75
[58] Field of Search .................................. 372/96, 50, 75

[56] References Cited

U.S. PATENT DOCUMENTS

| | | | |
|---|---|---|---|
| 4,873,696 | 10/1989 | Coldren et al. | 372/96 |
| 4,906,839 | 3/1990 | Lee | 258/239 |
| 5,115,441 | 5/1992 | Kopf et al. | 272/45 |
| 5,115,442 | 5/1992 | Lee et al. | 372/45 |
| 5,170,407 | 12/1992 | Schubert et al. | 372/96 |
| 5,206,872 | 4/1993 | Jewell et al. | 372/46 |
| 5,212,703 | 5/1993 | Kahen | 372/46 |
| 5,212,706 | 5/1993 | Jain | 372/50 |
| 5,341,390 | 8/1994 | Yamada et al. | 372/45 |
| 5,343,487 | 8/1994 | Scott et al. | 372/46 |
| 5,345,456 | 9/1994 | Dai et al. | 372/22 |
| 5,363,390 | 11/1994 | Yang et al. | 372/22 |

FOREIGN PATENT DOCUMENTS

| | | |
|---|---|---|
| 63-280484A | 11/1988 | Japan . |
| 5-145173A | 6/1993 | Japan . |

OTHER PUBLICATIONS

McDaniel et al., "*Vertical Cavity Surface–Emitting Semiconductor Laser with CW Injection Laser Pumping*" (Mar. 1990) 2(3) IEEE Photonics Tech. Lett., 156–158.

Lin et al., "*Photopumped Long Wavelength Vertical–Cavity Surface–Emitting Lasers Using Strain–Compensated Multiple Quantum Wells*" (Jun. 20 1994) 64(25) Appl. Phys. Lett., 3395–3397.

Optical Concepts, Inc. "*Vertical–Cavity Lasers for Sub–Carrier Multiplexed 1.55 μWDM Systems for Distributed Computing*" (Oct. 15 1994) Final Report Contract No. DASG60–94–C–0039.

Optical Concepts, Inc. "*A Wavelength Division Multiplexed Fiber–Optic Digital Communication System for Long Haul Parallel High Speed (32 Gb/sec) Communication over a Single Fiber Optic Cable*" (Aug. 28 1994) Quarterly Technical Progress Report No. 2 Contract No. DASG60–94–C–0022.

Optical Concepts, Inc. "*A Wavelength Division Multiplexed Fiber–Optic Digital Communication System for Long Haul Parallel High Speed (32 Gb/sec) Communication over a Single Fiber Optic Cable*" (Dec. 23 1994) Quarterly Technical Progress Report No. 3 Contract No. DASG60–94–C–0022.

Optical Concepts, Inc. "*A Wavelength Division Multiplexed Fiber–Optic Digital Communication System for Long Haul Parallel High Speed (32 Gb/sec) Communication over a Single Fiber Optic Cable*" (Mar. 24 1995) Quarterly Technical Progress Report No. 4 Contract No. DASG60–94–C–0022.

Optical Concepts, Inc. "*Long–Wavelength Vertical Cavity Surface–Emitting Lasers with Vertically Integrated Optical Pump*" (Dec. 19 1994) White Paper.

(List continued on next page.)

*Primary Examiner*—Rodney B. Bovernick
*Assistant Examiner*—Robert McNutt
*Attorney, Agent, or Firm*—Townsend and Townsend and Crew

[57] ABSTRACT

A long wavelength VCSEL according to the present invention is optically coupled to and optically pumped by a shorter wavelength, electrically pumped VCSEL. Short wavelength radiation emitted from the top surface of the underlying VCSEL is transmitted through the lower mirror of the long wavelength VCSEL. Long wavelength radiation is preferably emitted from the top surface of the long wavelength VCSEL. The two VCSELs are preferably joined together using a transparent optical adhesive, a wafer-fusing process, or a metal to metal bond.

22 Claims, 11 Drawing Sheets

OTHER PUBLICATIONS

Optical Concepts, Inc. *"Multi–Wavelength WDM Source Using Long–Wavelength Vertical Cavity Laser Array with Vertically Integrated Optical Pump"* (Jul. 13, 1994) U.S. Department of Defense Proposal ARPA 94–102.

Optical Concepts, Inc. *"Continuous–Wave, Single–Mode, VCSEL Arrays at 1300/1550 nm and Longer wavelengths, Using Vertically Integrated 980 nm VCSEL Optical Pump"* (Jan. 12 1995) U.S. Department of Defense Proposal AF95–135.

Optical Concepts, Inc. *"Continuous–Wave, Single–Mode, VCSEL Arrays at 1300/1550 nm and Longer Wavelengths, Using Vertically Integrated 980 nm VCSEL Optical Pump"* (Jan. 12 1995) U.S. Department of Defense Proposal AF95–106.

J. J. Dudley et al. *"Low Threshold, Wafer Fused Long Wavelength Vertical Cavity Lasers"* (Mar. 21 1994) 64(12) Appl. Phys. Lett., 1463–1465.

Dubravko Babic et al. *"Double–Fused 1.52 µVertical–Cavity Lasers"* (Feb. 27 1995) 66(9) Appl. Phys. Lett., 1030–1032.

T. Baba et al. *"Near Room Temperature Continuous Wave Lasing Characteristics of GaInAsP/InP Surface Emitting Laser"* (May 13 1993) 29(10) Electronic Letters, 913–914.

C. L. Chua et al. *"Dielectrically–Bonded Long Wavelength Vertical Cavity Laser on GaAs Substrates Using Strain–Compensated Multiple Quantum Wells"* (Dec. 1994) 6(12) IEEE Photonics Technology Letters, 1400–1402.

D. I. Babic et al. "Double–Fused 1.52–µVertical–Cavity Lasers" (Oct. 31–Nov. 3 1994) LEOS '94 Conference Proceedings 1, IEEE Lasers and Electro–Optics Society 7th Annual Meeting.

James J.Dudley *"Wafer Fused Vertical Cavity Lasers"* (Aug. 1994) ECE Technical Report #94–21 (especially Chapter 4).

PUMP
RADIATION

LONG WAVELENGTH, VERTICAL CAVITY SURFACE EMITTING LASER WITH VERTICALLY INTEGRATED OPTICAL PUMP

This invention was made with support of the United States Government under BMDO Contract No. DASG60-94-C-0022 managed by the U.S. Army Strategic Defense Command. The U.S. Government may have certain rights in this invention.

BACKGROUND OF THE INVENTION

This invention relates generally to integrated semiconductor lasers. Specifically, the present invention relates to optically pumped vertical cavity surface emitting lasers (VCSELs).

A VCSEL is a semiconductor laser consisting of a semiconductor layer of optically active material, such as gallium arsenide or indium gallium arsenide or the like, sandwiched between mirrors formed of highly-reflective layers of metallic material, dielectric material, epitaxially-grown semiconductor dielectric material or combinations thereof, most frequently in stacks. As is conventional, one of the mirror stacks is partially reflective so as to pass a portion of the coherent light built up in the resonating cavity formed by the mirror stack/active layer sandwich.

Laser structures require optical confinement in a cavity and carrier confinement to achieve efficient conversion of pumping electrons into stimulated photons through population inversion. The standing wave of reflected electromagnetic energy in the cavity has a characteristic cross-section giving rise to an electromagnetic mode. A desirable electromagnetic mode is the single fundamental mode, for example, the $HE_{11}$ mode of a cylindrical waveguide. A single mode signal from a VCSEL is easy to couple into an optical fiber, has low divergence and is inherently single frequency in operation.

The total gain of a VCSEL must equal its total loss in order to reach the lasing threshold. Unfortunately, due to the compact nature of VCSELs, the gain media is quite limited. This limitation results in a requirement that for efficient VCSELs, the mirrors have a reflectivity of greater than approximately 99.5 percent. This requirement is much more difficult to meet in long wavelength VCSELs than in short wavelength VCSELs since the mirrors cannot be grown in the same epitaxial step as the active region. For example, in a 980 nanometer GaAs VCSEL the mirrors can be grown using alternating layers of GaAs and AlGaAs. Since the refractive index difference between these two materials is 0.6, very few layers are required to form a suitable mirror. An analogous mirror design for a 1300 or 1550 nanometer VCSEL would use alternating layers of InP and InGaAsP. In this case, however, the refractive index difference is approximately 0.23. As a result, an InP/InGaAsP mirror must be much thicker to achieve the same reflectivity as a GaAs/AlGaAs mirror. Increasing thickness, however, does not work in practice since both absorption and diffraction losses increase as well, ultimately limiting the maximum achievable reflectivity.

Therefore, in order to form a useful long wavelength VCSEL, the mirrors must be formed of either evaporated dielectrics or lattice mismatched semiconductors. FIGS. 1 and 2 illustrate two possible mirror combinations described in the prior art. Both structures use at least one wafer-fused GaAs/AlAs mirror 2 which has a larger index difference than InP/InGaAsP. Wafer fusion is a known technique whereby semiconductors of differing lattice constants can be atomically joined, simply by applying mechanical pressure and heat. The structure shown in FIG. 1 uses an electrically insulating dielectric mirror 3 as the top mirror while the structure shown in FIG. 2 uses a second wafer-fused GaAs/AlGaAs mirror 2 as the top mirror.

The VCSEL structures shown in FIGS. 1 and 2 suffer from several problems associated with electrical injection of charge carriers into the active region. The structure of FIG. 1 has an insulating dielectric top mirror 3, thus requiring a metal ring contact 4 and injection around dielectric mirror 3 along the injection path 5. This contacting and injection scheme results in a complicated fabrication procedure. The structure of FIG. 2 uses injection through a conducting top mirror 2 with a metal contact 6. Mirror 2, however, is typically resistive and introduces significant resistive heating. Since the optical efficiency of materials such as InP and InGaAsP are known to degrade rapidly with temperature, the resistive heating will limit the device's output power. Finally, the structures of both FIGS. 1 and 2 as well as any other electrically injected VCSELs require p and n dopants inside of the optical cavity. The dopants introduce further optical loss which ultimately limits the output power.

An alternative to electrical pumping is optical pumping. Optical pumping avoids complex fabrication, resistive heating, and dopant-induced losses. One approach which has been used on a short wavelength VCSEL operating at 860 nanometers was described by McDaniel et al. in an article entitled *Vertical Cavity Surface-Emitting Semiconductor Laser with CW Injection Laser Pumping*, IEEE Photonics Tech. Lett., 2 (3) (Mar. 1990) 156–158. The authors used an array of in-plane semiconductor lasers as a pump source for a single short wavelength VCSEL. In a different approach to optical pumping, Lin et al. demonstrated a long wavelength VCSEL structure consisting of 30 pairs of compressive strained wells and tensile strained barriers and $Si/SiO_2$ dielectric mirrors optically pumped with a mode-locked Ti-sapphire laser. *Photopumped Long Wavelength Vertical-Cavity Surface-Emitting Lasers Using Strain-Compensated Multiple Quantum Wells*, Appl. Phys. Lett. 64 (25) (20 Jun. 1994) 3395–3397. Neither of the above approaches, nor any other approach using an in-plane semiconductor laser, dye laser, or solid-state laser pump, is practical for commercial VCSELs. Practical commercial VCSELs must be manufacturable and testable on a wafer scale in order to have a clear commercial advantage over in-plane semiconductor lasers.

From the foregoing, it is apparent that what is needed is a compact optically pumped long wavelength VCSEL which is manufacturable and testable on a wafer scale.

SUMMARY OF THE INVENTION

The present invention provides a long wavelength VCSEL which is optically pumped with a short wavelength VCSEL.

In brief, a long wavelength VCSEL according to the present invention is optically coupled to and optically pumped by a shorter wavelength, electrically pumped VCSEL. Short wavelength radiation emitted from the top surface of the underlying VCSEL is transmitted through the lower mirror of the long wavelength VCSEL. In the preferred embodiment, long wavelength radiation is emitted from the top surface of the long wavelength VCSEL. The two VCSELs are preferably joined together using a transparent optical adhesive, a wafer-fusing process, or a metal to metal bond.

In a specific embodiment, the short wavelength VCSEL emits at 980 nanometers and the long wavelength VCSEL emits at either 1300 or 1550 nanometers. The long wavelength VCSEL employs either wafer-fused, undoped mirrors of GaAs/AlAs, GaAs/AlGaAs, or AlGaAs/AlAs, or dielectric mirrors formed from alternating layers of $SiO_2$ and $TiO_2$ or some other dielectric combination.

Long wavelength VCSELs which emit at either 1300 or 1550 nanometers, pumped by 980 nanometer VCSELs, are particularly useful for fiber-optic communication systems. As single devices, these long wavelength VCSELs can replace expensive distributed feedback lasers in modest power applications. In arrays, these VCSELs open up the possibility of long distance parallel data transmission, either with a ribbon of optical fiber, or by wavelength-division-multiplexing of several VCSELs onto a single optical fiber. One and two dimensional arrays are also useful for free space optical interconnection.

In a second embodiment, the two VCSELs are separated by a mechanical spacer. A set of GaAs microlenses formed directly on the GaAs substrate are used to focus the radiation from the pump VCSEL into the long wavelength VCSEL. This embodiment is useful for achieving high output powers since a large diameter, short wavelength VCSEL can be used to optically pump a smaller diameter, long wavelength VCSEL. The GaAs microlenses can be replaced by separate microlenses of a different material.

A further understanding of the nature and advantages of the present invention may be realized by reference to the remaining portions of the specification and the drawings.

DESCRIPTION OF SPECIFIC EMBODIMENTS

An alternative to electrical injection of charge carriers into the active region is light injection at a wavelength shorter than the desired emission. The injected light is absorbed in the long wavelength cavity, generating electrons and holes. These charge carriers in turn diffuse into the quantum wells and re-emit at the longer wavelength. Since optical pumping does not require electrical contacts, fabrication is much simpler and resistive heating does not occur. In addition, since the carriers are injected by light, the light can be injected through the mirrors. In electrical pumping schemes the injection must occur around the mirror, assuming that the mirror is electrically insulating. Furthermore, in optical pumping schemes the cavity can be free of dopants, the dopants being a major source of optical loss in VCSELs utilizing electrical injection.

Figure 1:
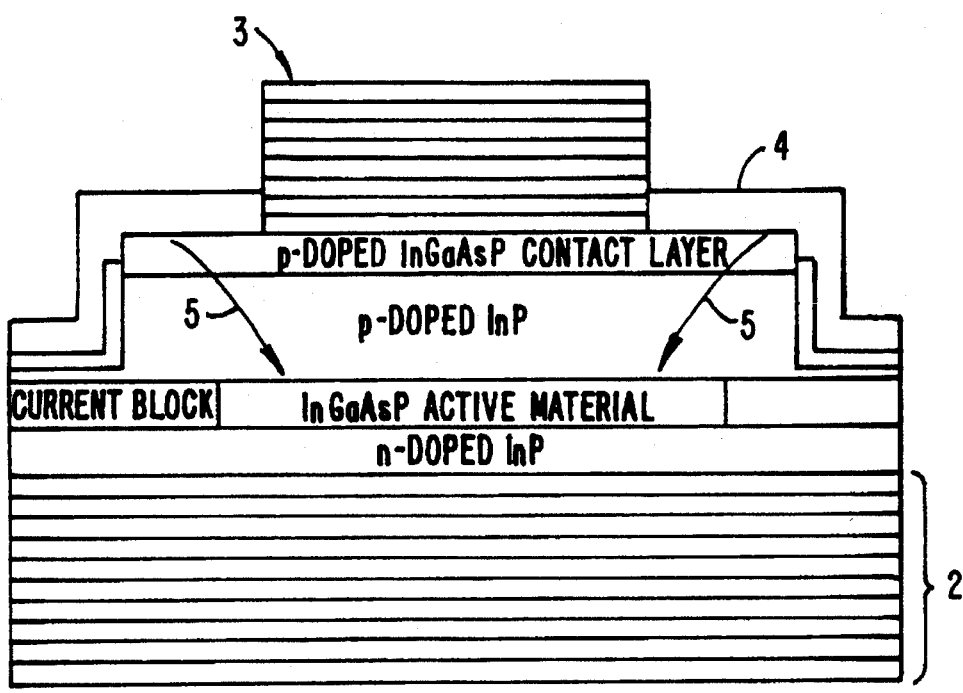
FIG. 1 is a schematic representation of a prior art electrically injected 1300/1550 nanometer VCSEL with a top dielectric mirror.
Figure 2:
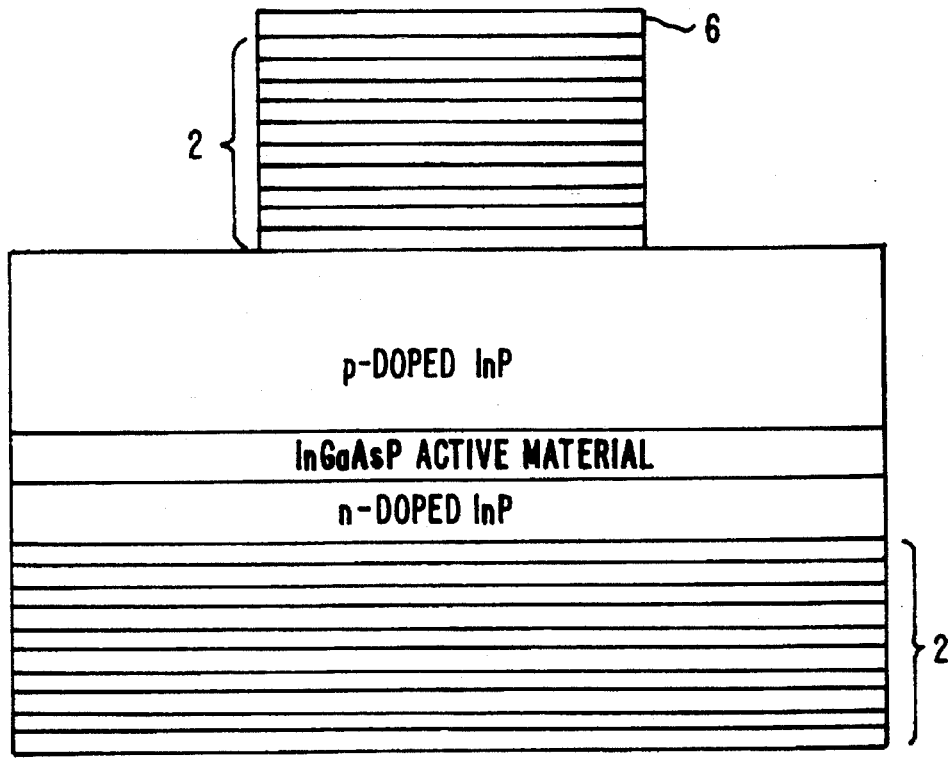
FIG. 2 is a schematic representation of a prior art electrically injected 1300/1550 nanometer VCSEL with two wafer-fused GaAs/AlGaAs mirrors.
Figure 3:
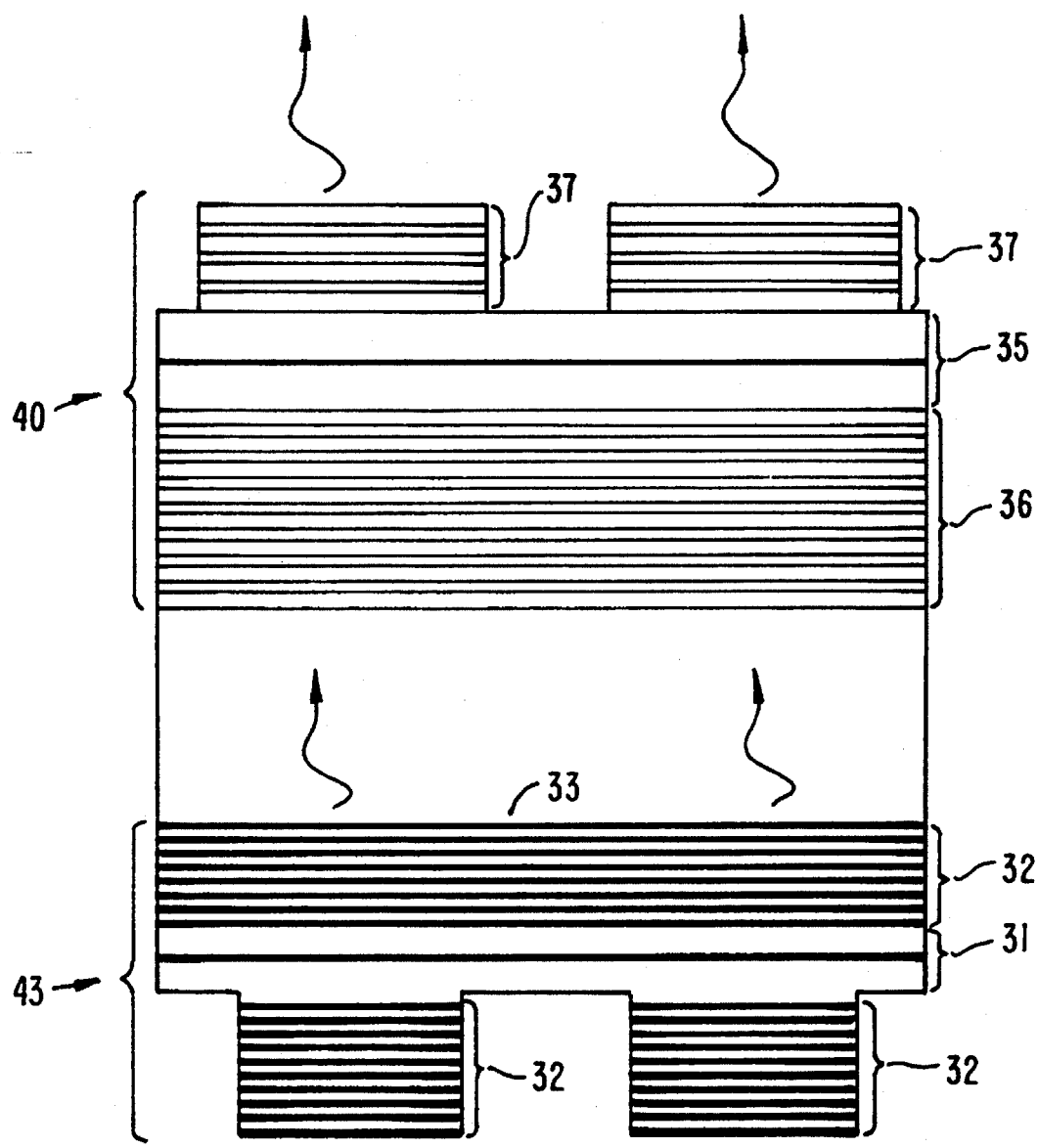
FIG. 3 is a schematic representation of a generic configuration of the present invention.

FIG. 3 is a schematic representation of a generic configuration of the present invention. This figure as well as succeeding device FIGS. 4-7, 9-11, and 17-18 show two short wavelength VCSELs 43 optically pumping two long wavelength VCSELs 40. This configuration is not intended to be limiting, but to indicate schematically the wafer-scale nature of the fabrication technology. This same technology can be used to make single devices consisting of one short wavelength VCSEL pumping one long wavelength VCSEL, or to make large one and two dimensional arrays.

Lasers 43 are a pair of electrically pumped, short wavelength VCSELs. They are comprised of a short wavelength active region 31 interposed between short wavelength mirrors 32. Short wavelength radiation is emitted from a top surface 33 of VCSELs 43 into the bottom surface of a second pair of VCSELs 40. VCSELs 40 are a pair of long wavelength VCSELs comprised of a long wavelength active region 35 interposed between a bottom mirror 36 and top mirrors 37. Mirrors 36 and 37 are long wavelength mirrors. Mirror 36 is transparent to the short wavelength radiation emitted by VCSELs 43. Long wavelength radiation is emitted from top mirrors 37. Modulation of the long wavelength radiation is accomplished by modulating the short wavelength pump VCSELs. In an alternate embodiment, modulation is accomplished by applying contacts to the long wavelength VCSELs.

FIG. 3 and succeeding device schematics show the short wavelength VCSEL bottom mirrors 32 and long wavelength VCSEL top mirrors 37 as vertically etched to form cylindrical posts. These posts divide up the initially planar wafer into many refractive index guided devices. Index guiding is well known in the art, and can be accomplished by etching, lateral oxidation, implantation, diffusion, regrowth, or selective growth. In the preferred embodiment, both short wavelength and long wavelength VCSELs should be index guided, although the short wavelength VCSELs could be gain guided or thermally lensed.

The optically pumped configuration of FIG. 3 retains the advantages of VCSELs in general, such as the possibility of wafer-scale fabrication and testing, and inexpensive one and two dimensional array fabrication. This is in marked contrast to VCSELs which used solid-state, dye, or in-plane semiconductor lasers as the optical pump. Optically pumped VCSELs which employ these latter approaches are impractical for array applications and cannot be manufactured or tested on a wafer scale.

Figure 4:
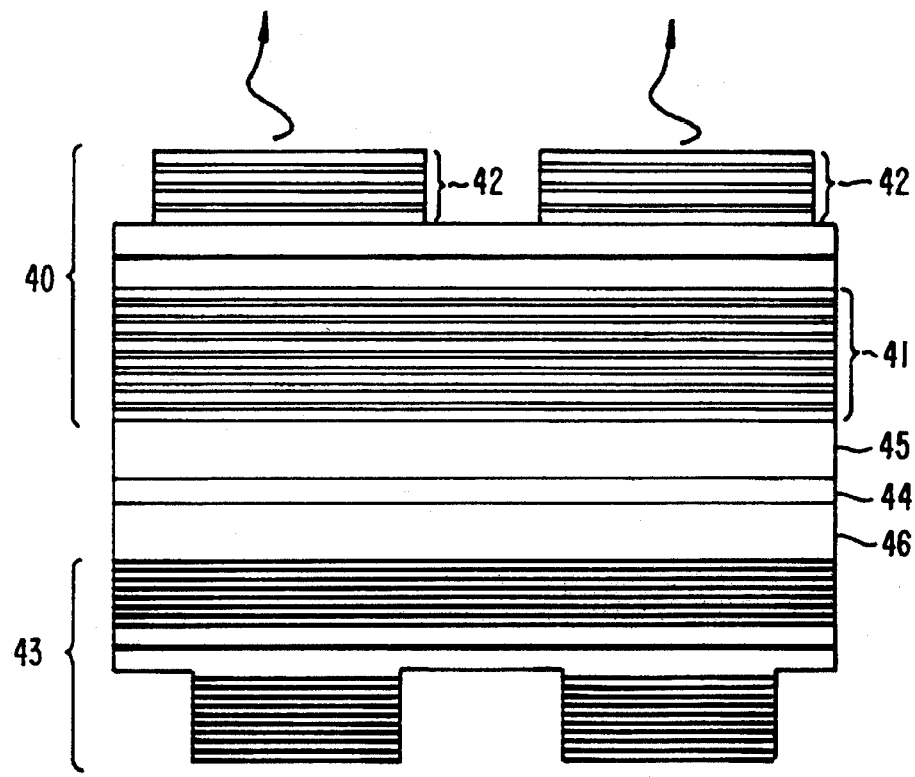
FIG. 4 is a schematic representation of an embodiment of the invention in which a pair of long wavelength VCSELs are joined to a pair of short wavelength VCSELs using optical adhesive.
Figure 5:
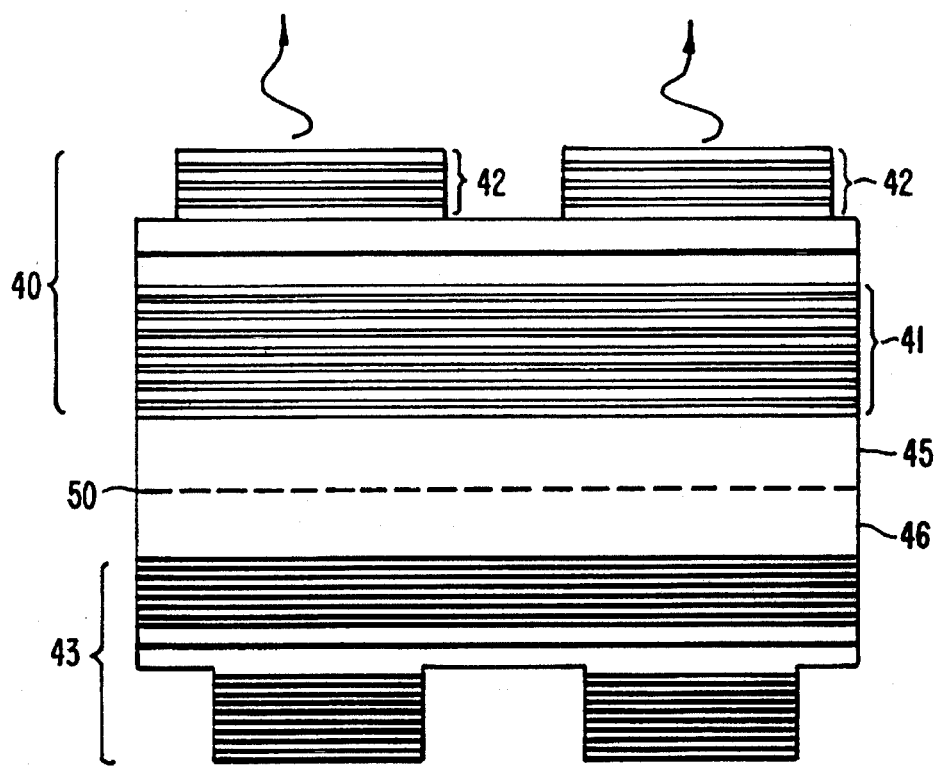
FIG. 5 is a schematic representation of an embodiment of the invention in which a pair of long wavelength VCSELs are joined to a pair of short wavelength VCSELs using wafer fusion.
Figure 6:
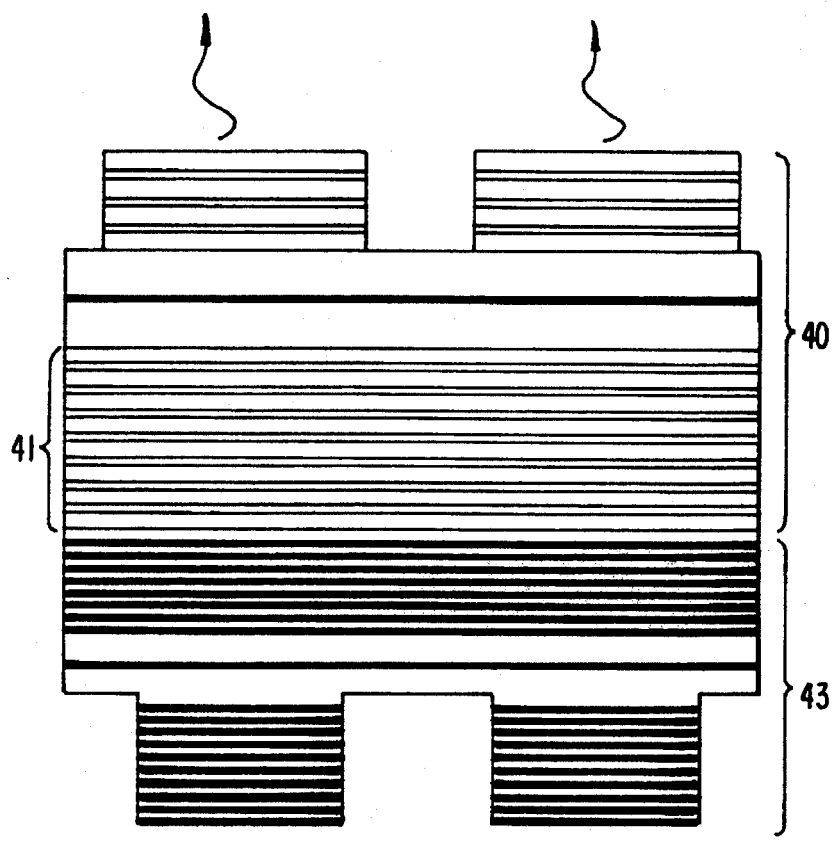
FIG. 6 is a schematic representation of an embodiment of the invention in which the bottom mirrors of the long wavelength VCSELs are grown in the same step as the short wavelength VCSELs.

FIG. 4 is a schematic representation of one embodiment of the invention. Long wavelength VCSELs 40 employ a wafer-fused, undoped, GaAs/AlAs mirror 41 on the bottom side, and dielectric mirrors 42 on the top side. Dielectric mirrors 42 are formed from alternating layers of silicon dioxide, $SiO_2$, and titanium dioxide, $TiO_2$. Dielectric mirrors 42 can also be formed using other dielectric materials. Long wavelength VCSELs 40 are fixed to short wavelength VCSELs 43 by means of a transparent optical adhesive 44 between GaAs substrates 45 and 46. FIG. 5 is essentially the same embodiment as shown in FIG. 4 except GaAs substrate 45 of long wavelength VCSELs 40 is wafer-fused to GaAs substrate 46 of short wavelength VCSELs 43 at an interface 50. This approach eliminates the need for an optical adhesive, possibly leading to a reduction in parasitic reflections. In an alternative embodiment shown in FIG. 6, GaAs/AlAs mirror 41 can be grown in the same epitaxial step as VCSELs 43, thus eliminating the need for either an optical adhesive 44 or wafer fusion 50 at this interface.

Figure 7:
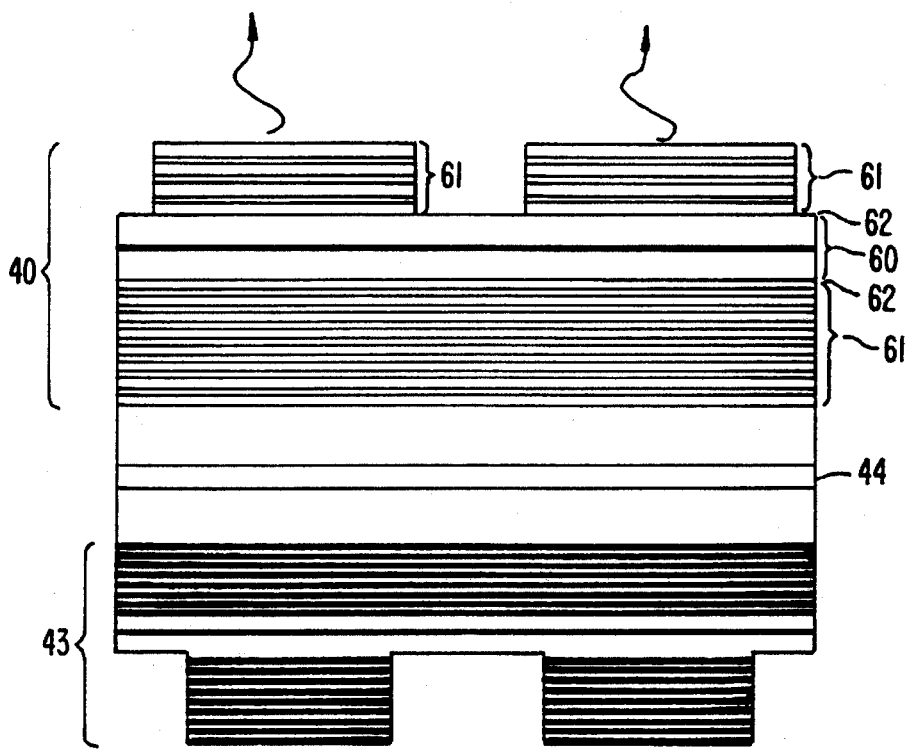
FIG. 7 is a schematic representation of an alternate embodiment of the invention.

FIG. 7 is a schematic representation of an alternate embodiment of the invention. Long wavelength VCSELs 40 are comprised of a long wavelength active region 60 interposed between two GaAs/AlAs mirrors 61. Active region 60 is wafer-fused to mirrors 61 at interfaces 62. In the embodiment shown, the double-fused structure is joined to short wavelength VCSELs 43 with optical adhesive 44. The double-fused structure can also be wafer fused to VCSELs 43 as illustrated in FIG. 5.

Figure 8:
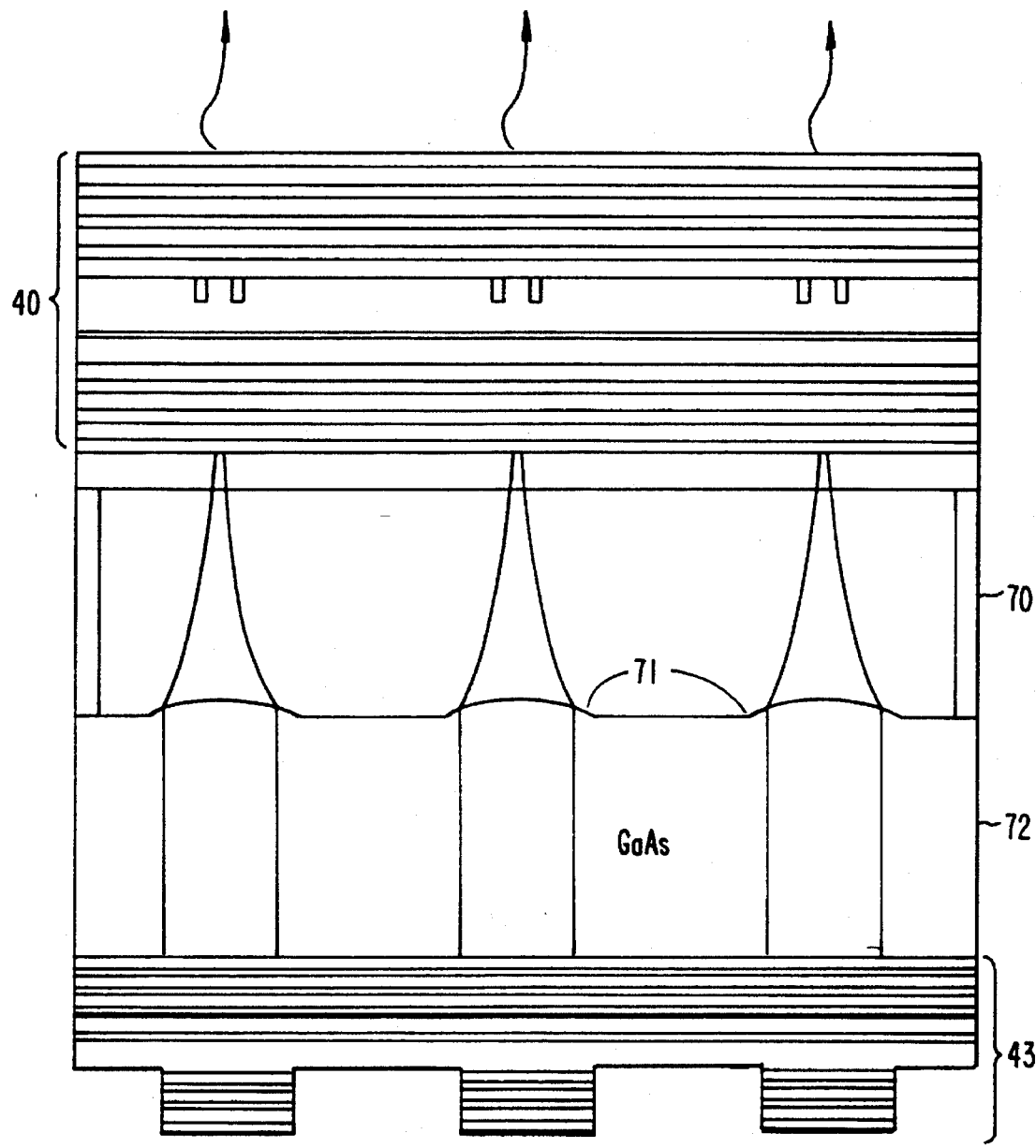
FIG. 8 is a schematic representation of an embodiment of the invention utilizing integrated microlenses.

FIG. 8 is a schematic representation of an embodiment utilizing integrated microlenses. As in the previous embodiments, multiple short wavelength VCSELs 43 are used to optically pump multiple long wavelength VCSELs 40. However, in this embodiment the arrays of VCSELs are separated by a mechanical spacer 70. Between the arrays of VCSELs are a set of GaAs microlenses 71 which are used to focus the radiation from VCSELs 43 into VCSELs 40. Microlenses 71 are formed directly in the GaAs substrate 72 of the short wavelength VCSELs (shown), directly in the GaAs substrate of the long wavelength VCSELs (not shown), or both. Thus a large diameter, short wavelength VCSEL can be used to optically pump a smaller diameter, long wavelength VCSEL. This configuration allows higher power outputs to be achieved in the long wavelength VCSEL. In an alternate embodiment, microlenses 71 are formed of a material other than GaAs, such as a glass or a reflowable polymer. In this alternate configuration microlenses 71 are not monolithically integrated with the other parts of the device.

Figure 9:
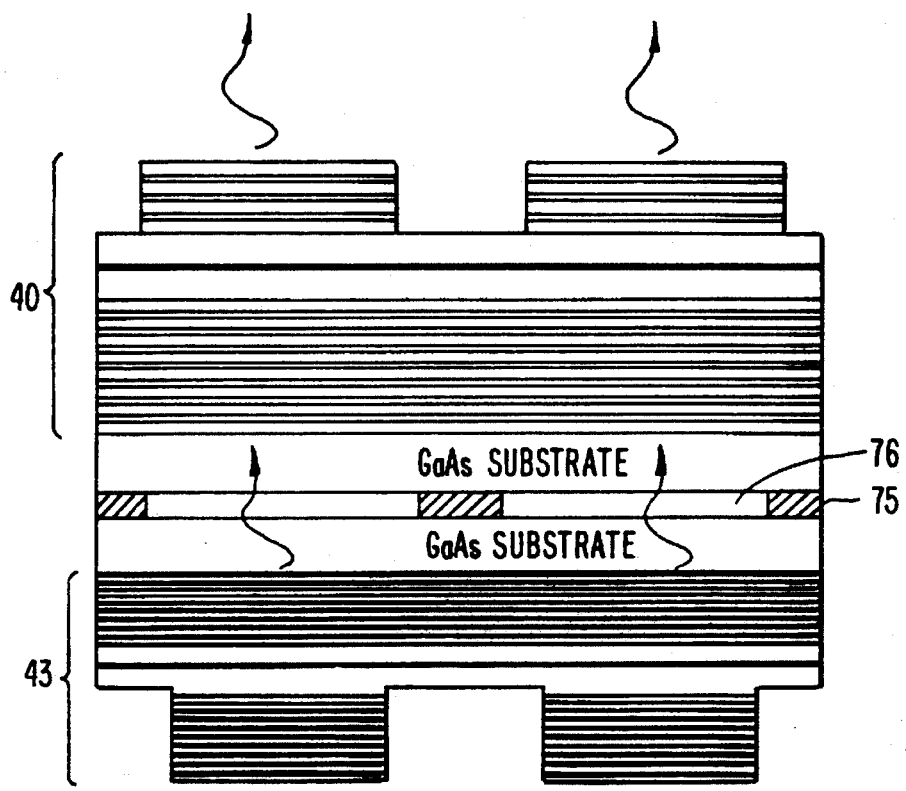
FIG. 9 illustrates an alternate technique of attaching the long wavelength VCSELs to the short wavelength VCSELs using metal to metal bonding.

FIG. 9 illustrates an alternate technique of attaching long wavelength VCSELs 40 to short wavelength VCSELs 43. In this approach the two pairs of VCSELs are joined at a metal interface 75 using metal to metal bonding. A set of windows 76 in metal interface 75 allow the pump radiation to pass through. Microlenses can be incorporated into the windows (not shown). Although a variety of metals can be used for the bonding metal, the preferred embodiment uses either palladium or indium containing solder.

Figure 10:
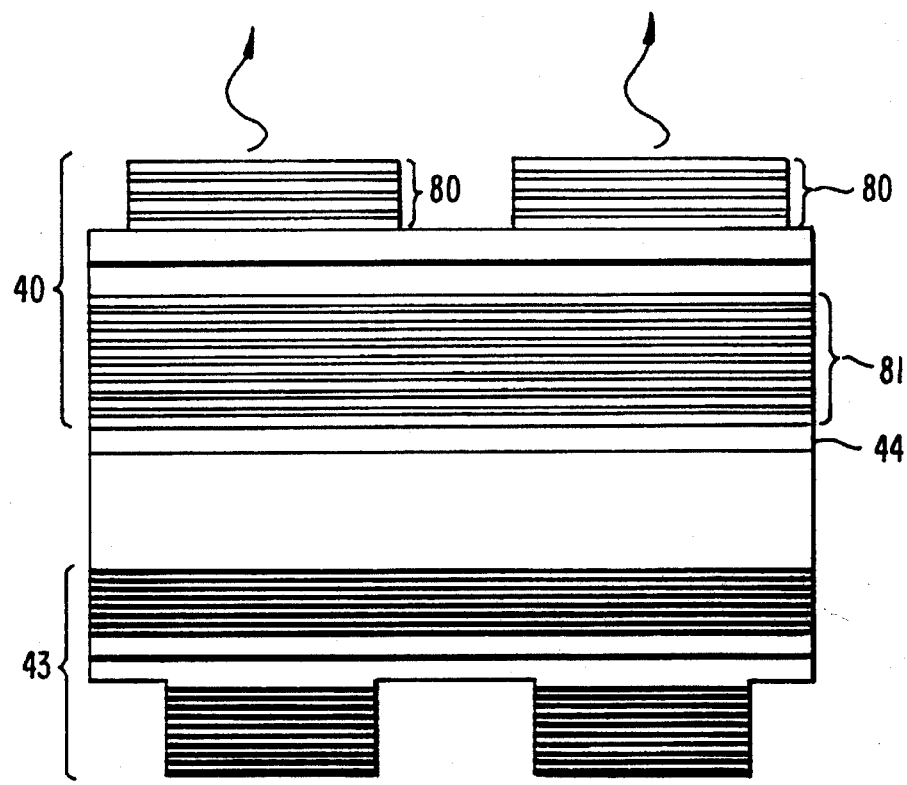
FIG. 10 is an embodiment of the invention in which both the bottom and top mirrors of the long wavelength VCSELs utilize dielectrics.

FIG. 10 is a schematic representation of an embodiment of the invention in which VCSELs 40 utilize dielectric mirrors 80 and 81. By using optical adhesive 44 to join VCSELs 40 to VCSELs 43, this embodiment does not require the use of the wafer fusion process. In an alternate embodiment, dielectric mirror 81 is joined to VCSELs 43 using a dielectric to semiconductor bond which is known in the art.

Figure 11:
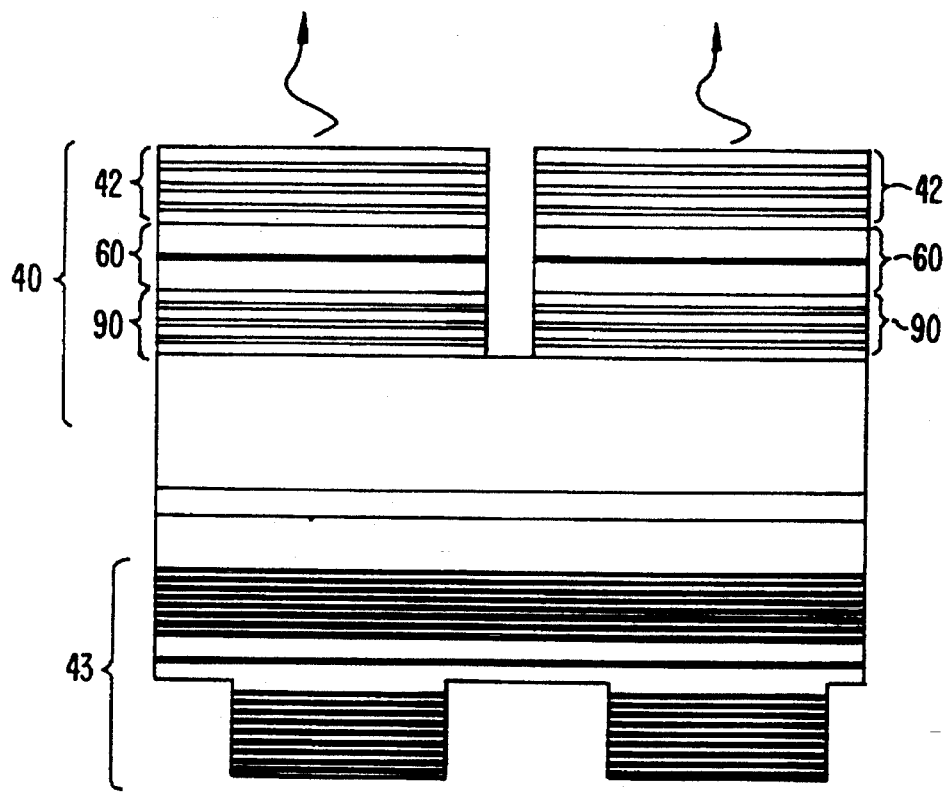
FIG. 11 is a schematic representation of an embodiment utilizing lateral oxidation.

In the embodiment of the invention shown schematically in FIG. 11, long wavelength active region 60 is interposed between dielectric mirror 42 and a bottom mirror 90. Mirror 90 is formed by epitaxially growing alternating layers of InP and InAlAs. To create the final mirror the structure is etched, exposing the sidewalls of the InAlAs material. The aluminum in the InAlAs is then oxidized in from the sides, creating $In_wAl_xAs_yO_z$ which has a much lower refractive index than InAlAs or InP. The result is that a low reflectivity mirror is converted to a high reflectivity mirror. The lateral oxidation technique can also be accomplished with compounds containing aluminum and antimony.

Figure 12:
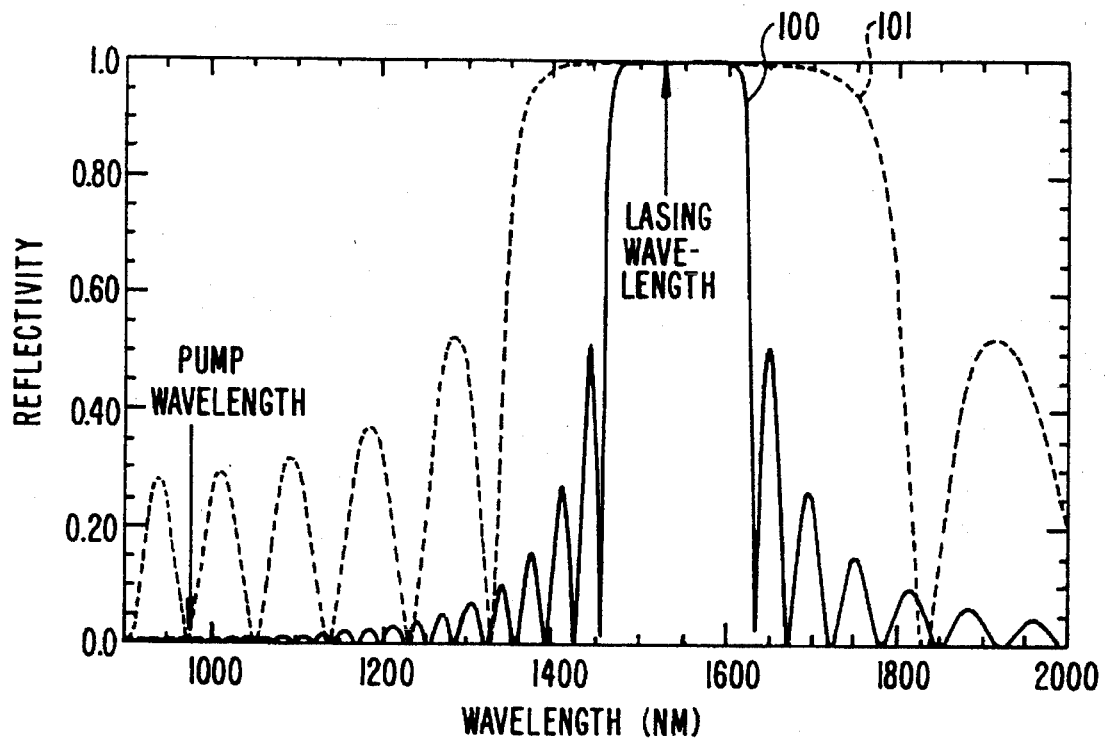
FIG. 12 is the reflectivity graphs for a GaAs/AlAs mirror and a $SiO_2/TiO_2$ mirror.

FIG. 12 shows the reflectivity graphs for two particular mirror designs for an embodiment of the invention in which short wavelength VCSELs 43 emit at 980 nanometers and long wavelength VCSELs 40 emit at 1550 nanometers. Graph 100 is the reflection spectra for a GaAs/AlAs mirror suitable for the bottom mirror of VCSELs 40. This mirror transmits the pump wavelength and reflects the long wavelength of VCSELs 40. Graph 101 is the reflection spectra for a $SiO_2/TiO_2$ dielectric mirror suitable for the top mirrors of VCSELs 40. The dielectric mirror can be designed to either transmit or reflect at VCSEL 43s' wavelength. If the dielectric transmits at this wavelength, as shown in plot 101, then VCSELs 40 only see one pass of the radiation from pump VCSELs 43. If the dielectric reflects at the pump wavelength (not shown), then VCSELs 40 see two passes of the radiation from pump VCSELs 43. By making the dielectric mirror partially reflecting it is possible to design a double-pass configuration which increases the absorption and therefore the pumping efficiency. It is also possible to make both the top and bottom mirrors of the long wavelength VCSELs partially reflecting at the pump wavelength, creating resonant pump absorption and an increase in pumping efficiency. This last configuration, however, is difficult to implement.

Figure 13:
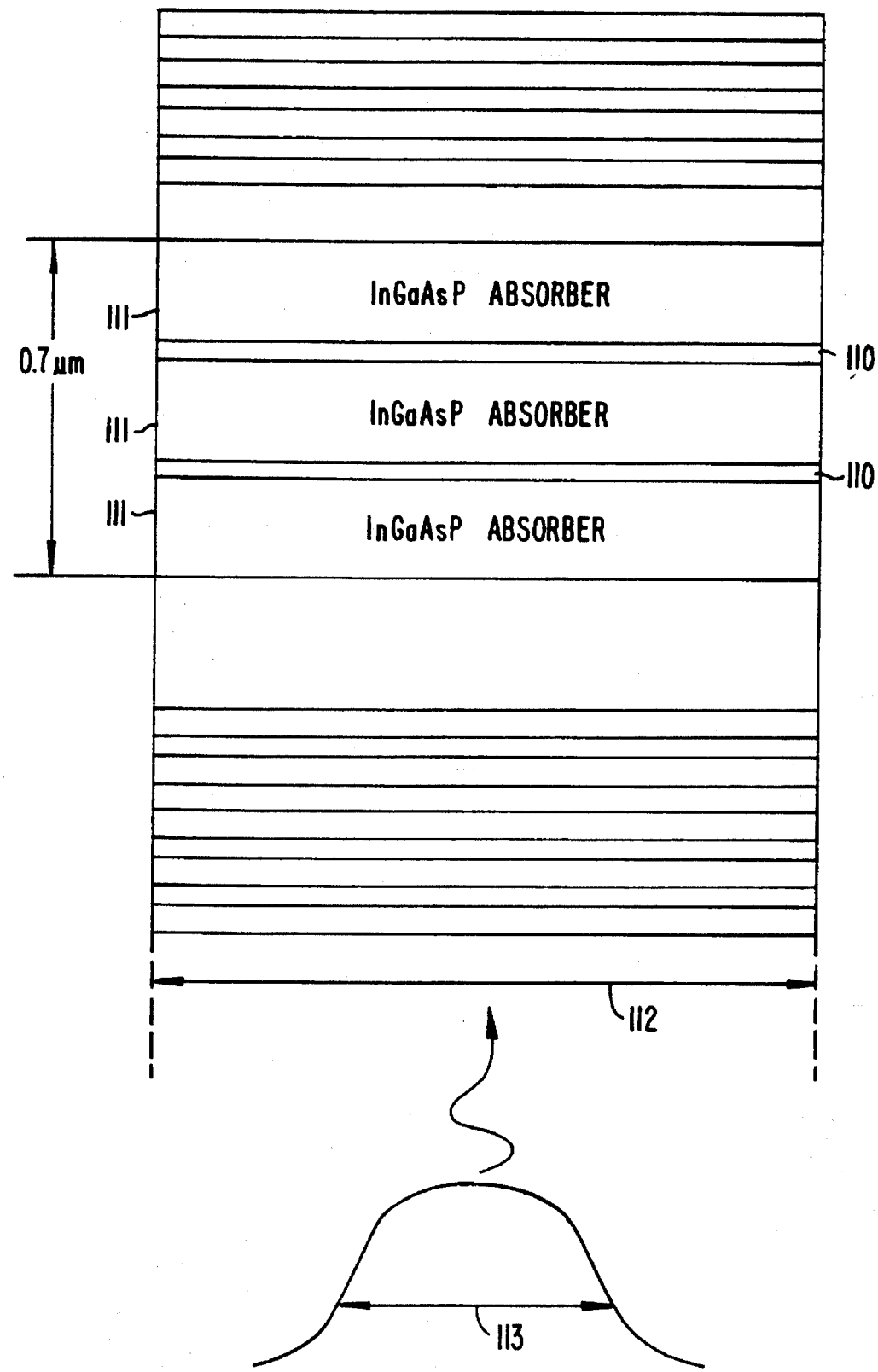
FIG. 13 is a schematic representation of a specific long wavelength VCSEL suitable for use in this invention.

FIG. 13 is a schematic representation of a specific long wavelength VCSEL suitable for use in this invention. Two lattice matched InGaAs quantum wells 110 are placed on two peaks of the optical standing wave. Quaternary InGaAsP material 111 surrounding these wells absorbs the pump radiation and funnels the charge carriers into the wells where they re-emit at 1550 nanometers. The absorption coefficient of this material is on the order of $1.5 \times 10^4$ cm$^{-1}$, so for the lengths indicated 90 percent of the incident radiation is absorbed in two passes through the cavity. FIG. 13 also shows that the long wavelength cavity has a larger transverse dimension 112 than the pump transverse dimension 113. This ensures not only more efficient conversion of the pump radiation into the long wavelength radiation but also single transverse mode operation by the long wavelength VCSEL. In the preferred embodiment, transverse dimension 112 of the long wavelength VCSEL is defined by a lateral refractive index variation (i.e., index guided). The index variation can be defined in any or all of the vertical layers of the device, and can be accomplished by chemical etching, regrowth, implantation, diffusion, disordering, selective growth, or other techniques. Index guiding is well known in the art of semiconductor lasers.

Figure 14:
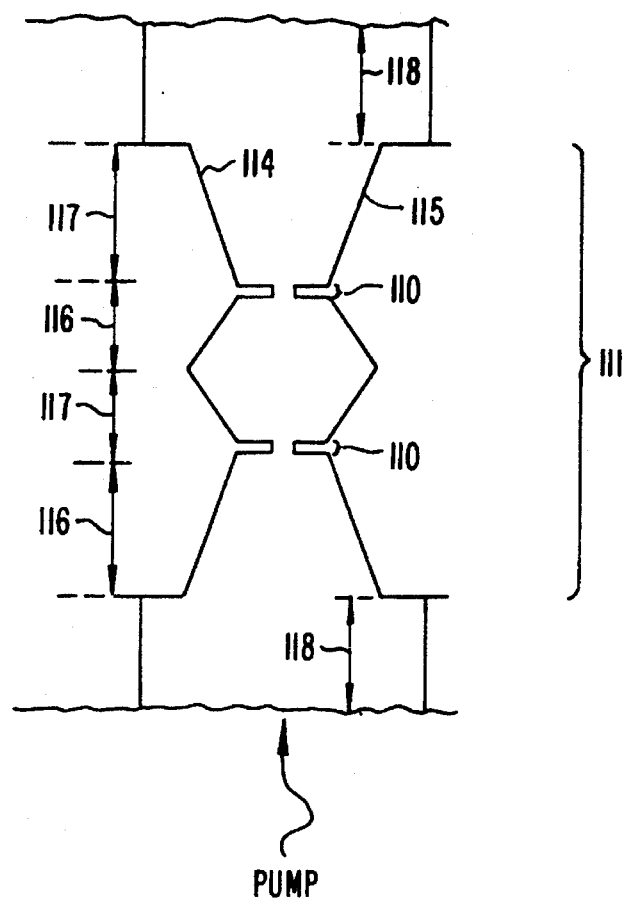
FIG. 14 is a detailed energy band diagram of the preferred absorber design for the embodiment shown in FIG. 13.

FIG. 14 is a detailed energy band diagram of the preferred absorber design for the embodiment shown in FIG. 13. The vertical axis of this diagram represents vertical distance in the structure while the horizontal axis represents relative energy. Graph 114 shows the energy level as a function of vertical distance for the valence band. Graph 115 shows the energy level as a function of vertical distance for the conduction band. In this embodiment absorbing material 111 is compositionally graded to create a built-in electric field. The built-in electric field aids in the speed and efficiency with which photogenerated charge carriers are collected in quantum wells 110. In this design absorber 111 is comprised of compositionally graded InGaAsP 116 and 117. Portions 116 are graded from 1.15 micrometer bandgap material on the bottom to 1.3 micrometer bandgap material on the top. Portions 117 are graded from 1.3 micrometer bandgap material on the bottom to 1.15 micrometer bandgap material on the top. A buffer layer 118 of InP is also shown in this diagram. Although FIG. 13 and the following calculations assume lattice matched quantum wells, ideally quantum wells 110 should be compressively strained with respect to the surrounding layers.

The power at 1550 nanometers versus the power at 980 nanometers, the wavelength of the pump VCSEL in the preferred embodiment, is given by:

$$i\ P_{1.5} = (P_{0.98} - P_{th}) \eta_i \eta_{conv} [(T/(T+A))] \quad (1)$$

where $\eta_i$=fraction of injected photons recombining radiatively in the wells $\eta_{conv}$=energy loss from 980 nm to 1550 nm =980/1550=0.63

$T$=fractional transmission of output mirror at 1550 nm $A$=fraction of light lost to absorption/scattering/diffraction per roundtrip $P_{th}$=pump power required to reach threshold.

Figure 15:
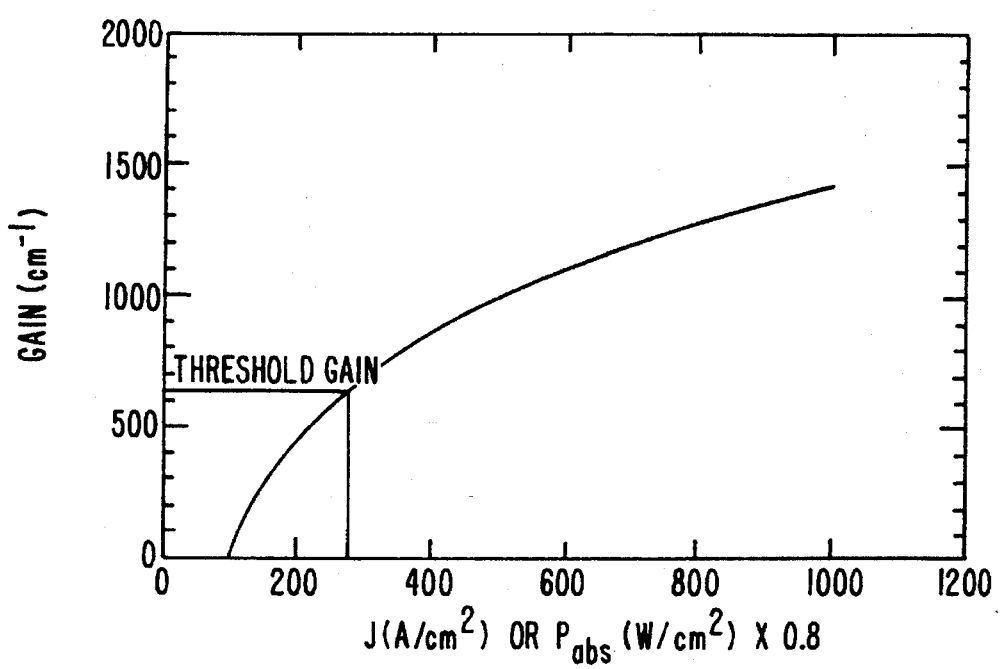
FIG. 15 is a plot of the gain curve for one InGaAs quantum well.

The threshold pump power can be calculated using the quantum-well gain curve shown in FIG. 15. To reach threshold, the quantum wells must provide a roundtrip gain equal to the roundtrip loss, which is T+A. Since the cavity is free of dopants, the roundtrip absorption/scattering/diffraction losses can be very small, approximately 0.1 percent. Given an output transmission of 0.3 percent, the threshold gain is 0.4 percent.

If both wells are pumped equally, a reasonable assumption for double-pass absorption, each well must provide a roundtrip gain of 0.2 percent, or 0.1 percent per pass. Given a well width of 80 angstroms, this requirement can be converted to a gain per unit length of 1250 cm$^{-1}$. This value can be converted into the required current or power density using FIG. 15. Since FIG. 15 does not include the periodic gain enhancement of 2 when the quantum wells are at the standing wave peak, the appropriate value for the gain per unit length is 1250/2=625 cm$^{-1}$. According to FIG. 15, achieving 625 cm$^{-1}$ gain requires 270 A/cm$^2$. The total required current density is 540 A/cm$^2$ since there are two quantum wells or, equivalently, the absorbed power density must be 680 W/cm$^2$. Assuming 85 percent of the pump radiation is absorbed, 800 W/cm$^2$ is needed to reach threshold. If this power is uniformly distributed over a 10 micrometer diameter VCSEL, then the total required power is 0.6 mW to reach threshold. Since some of the injected carriers may diffuse laterally outside the optical mode, the number of injected carriers required to reach threshold is higher than this number. Therefore to compensate for the lost carriers, the threshold power is adjusted to 1.0 mW.

Figure 16:
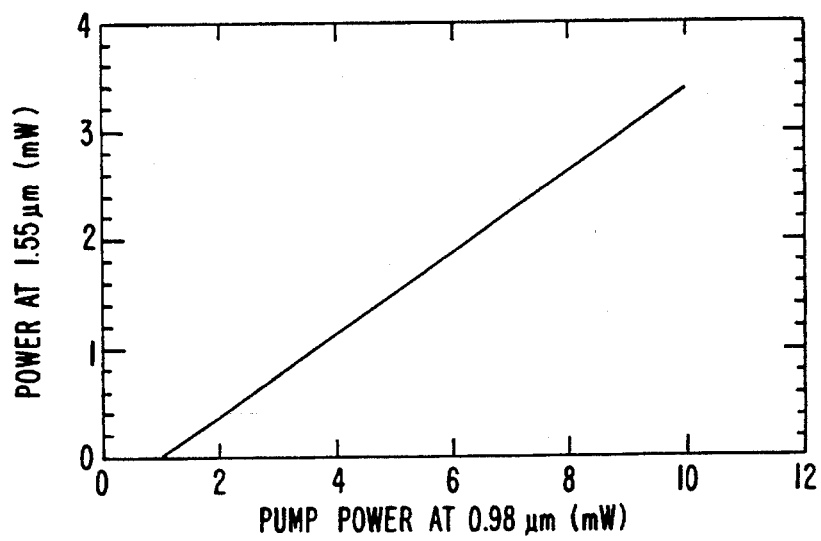
FIG. 16 is a plot of the pump power versus the output power for a specific embodiment of the invention.

FIG. 16 shows a graph of equation 1 assuming $\eta_i$=0.85 and $\eta_{conv}$=0.63. FIG. 16 illustrates that for this specific embodiment of the invention, approximately 1 mW of output power can be achieved with a 980 nanometers pump power of 4 mW. By increasing the pump power, improving the absorption efficiency, or using a more advanced gain medium, the output power can be increased. Higher output powers can also be obtained using the configuration illustrated in FIG. 8.

The power-out versus power-in graph of FIG. 16 is shown as linear over a large power range. Typical electrically pumped VCSEL curves show a rollover at large drive currents due to heating. This effect is not shown in FIG. 16 since heating during optical pumping is far less than during electrical pumping. For example, the thermal impedance of the structure shown in FIG. 4 is on the order of 1° K. per mW. This means that 1 mW of heat dumped into the cavity will result in a temperature rise of 1° K. In the example discussed above, a 4 mW pump was required to generate 1 mW of long wavelength output. Even if all of the remaining 3 mW's is converted to heat, an unlikely occurrence, the result would only be a temperature rise of 3° K. in the long wavelength cavity. In marked contrast, in an electrically pumped VCSEL several tens of degrees K. temperature rise could be expected.

Figure 17:
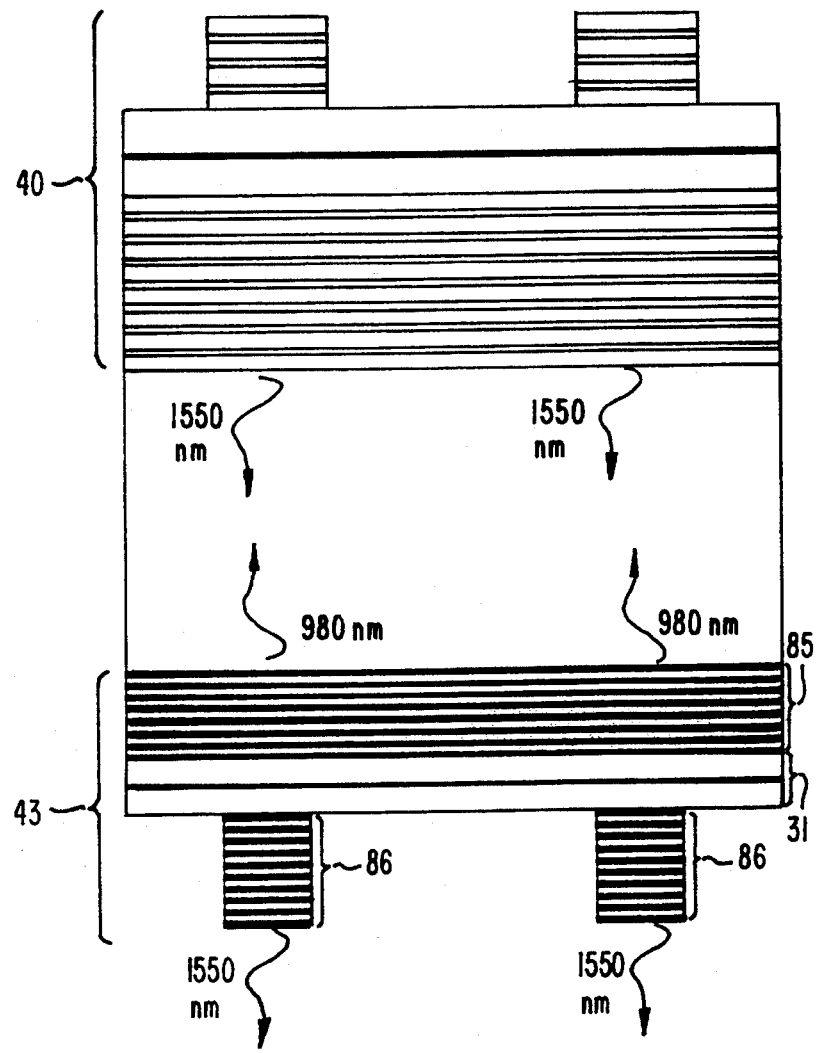
FIG. 17 is a schematic representation of an embodiment of the invention in which the long wavelength radiation from a pair of long wavelength VCSELs propagate in a direction opposite to that of the pump radiation.
Figure 18:
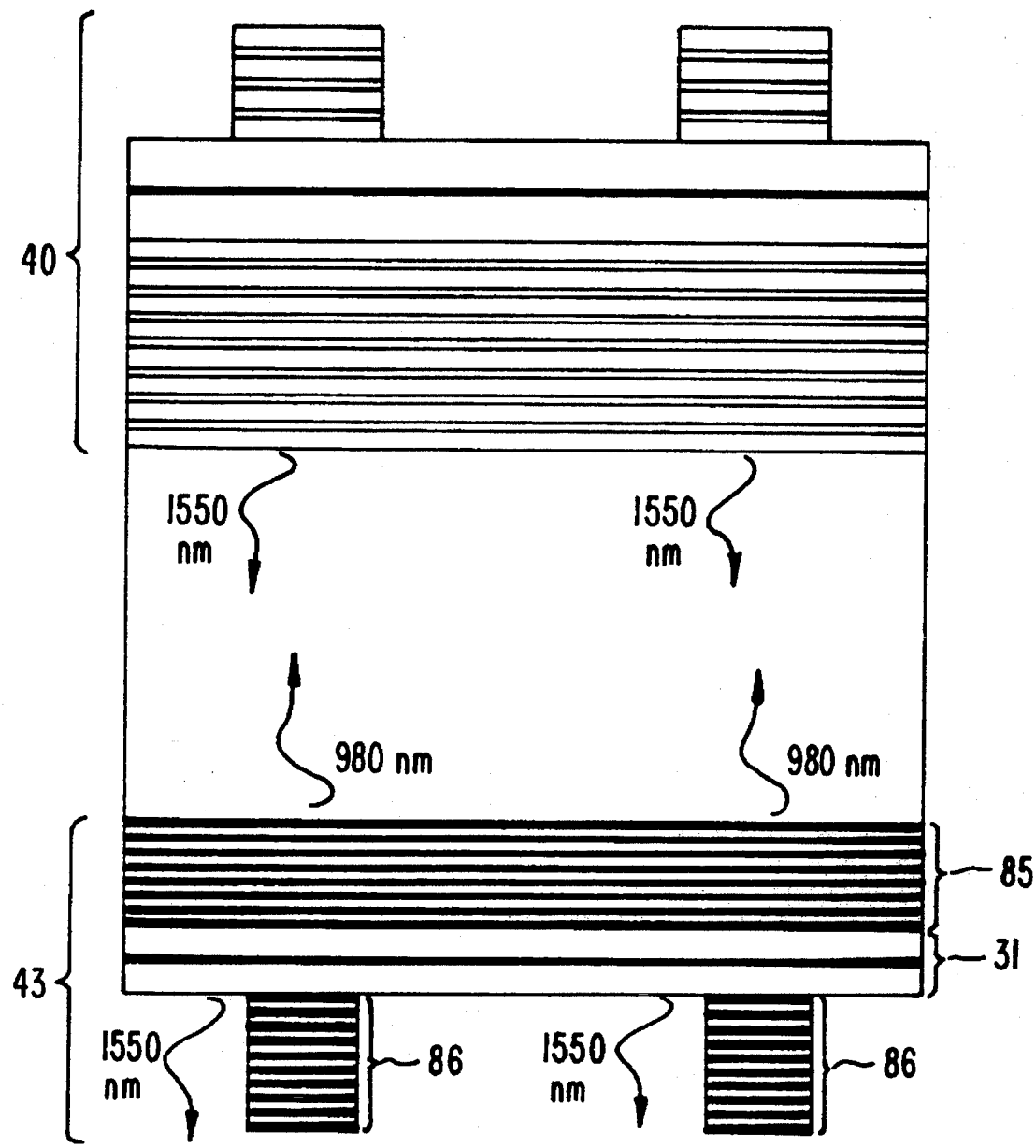
FIG. 18 is a schematic representation of an embodiment of the invention similar to that illustrated in FIG. 17 except that the long wavelength VCSELs are slightly angled from the short wavelength VCSELs.

In another embodiment of the invention, the long wavelength radiation propagates in a direction opposite that of the pump radiation. FIG. 17 is a schematic representation of one possible configuration of this embodiment. In this configuration short wavelength active region 31 is interposed between short wavelength mirrors 85 and 86. Mirrors 86 reflect essentially 100 percent of the short wavelength emission, but are essentially transparent to the long wavelength emission. In an alternate configuration schematically illustrated in FIG. 18, long wavelength VCSELs 40 are slightly angled in relation to short wavelength VCSELs 43. The angling of the two arrays allow the long wavelength radiation to bypass short wavelength mirrors 86.

As will be understood by those familiar with the art, the present invention may be embodied in other specific forms without departing from the spirit or essential characteristics thereof. Accordingly, disclosure of the preferred embodiment of the invention is intended to be illustrative, but not limiting, of the scope of the invention which is set forth in the following claims.

I claim:

1. An optical device, comprising:

a first vertical cavity surface emitting laser (VCSEL), said first VCSEL having a long wavelength active medium interposed between a first mirror and a second mirror, said first VCSEL emitting radiation at a first wavelength; and a second VCSEL integral with said first VCSEL, said second VCSEL electrically pumped and emitting radiation at a second wavelength, said second wavelength shorter than said first wavelength, wherein said second VCSEL optically pumps said first VCSEL.

2. The optical device of claim 1, further comprising means for electrically modulating said second VCSEL, wherein modulation of said second VCSEL modulates said first VCSEL.

3. The optical device of claim 1, further comprising means for electrically modulating said first VCSEL.

4. The optical device of claim 1, wherein said first and second mirrors transmit radiation at said second wavelength.

5. The optical device of claim 1, wherein said first mirror transmits radiation at said second wavelength and said second mirror reflects radiation at said second wavelength.

6. The optical device of claim 1, wherein at least one of said first and second mirrors of said first VCSEL is formed of alternating layers of materials selected from the group consisting of gallium arsenide, aluminum arsenide, aluminum gallium arsenide, and aluminum arsenide, wherein said mirror formed of said alternating layers is wafer-fused to said long wavelength active medium.

7. The optical device of claim 1, wherein at least one of said first and second mirrors is a dielectric mirror.

8. The optical device of claim 1, wherein at least one of said first and second mirrors is formed of alternating layers of indium phosphide and indium aluminum arsenic oxide.

9. The optical device of claim 1, wherein said first VCSEL is wafer-fused to said second VCSEL.

10. The optical device of claim 1, further comprising a layer of optical adhesive, said optical adhesive at an interface between said first VCSEL and said second VCSEL.

11. The optical device of claim 1, wherein said first VCSEL is joined to said second VCSEL using metal to metal bonding.

12. The optical device of claim 11, wherein said metal to metal bond is comprised of indium containing solder.

13. The optical device of claim 1, wherein said first mirror of said first VCSEL is formed of alternating layers of gallium arsenide and aluminum arsenide, and said first mirror and said second VCSEL are grown in a single epitaxial step.

14. The optical device of claim 1, wherein said first wavelength is approximately 1300 nanometers and said second wavelength is approximately 980 nanometers.

15. The optical device of claim 1, wherein said first wavelength is approximately 1550 nanometers and said second wavelength is approximately 980 nanometers.

16. The optical device of claim 1, wherein said first VCSEL has a first optical mode with a first transverse dimension and said second VCSEL has a second optical mode with a second transverse dimension, said first transverse dimension larger than said second transverse dimension.

17. The optical device of claim 1, wherein said first VCSEL has an optical mode defined by a lateral refractive index variation.

18. The optical device of claim 17, wherein said lateral refractive index variation is formed using a technique selected from the group consisting of chemical etching, regrowth, implantation, diffusion, disordering, or selective growth.

19. The optical device of claim 1, further comprising:

a mechanical spacer interposed between said first VCSEL and said second VCSEL; and at least one gallium arsenide microlens interposed between said first VCSEL and said second VCSEL, said microlens focussing the radiation from said second VCSEL onto said first VCSEL.

20. The optical device of claim 1, wherein said long wavelength active medium is comprised of a first plurality of second wavelength absorbing layers and a second plurality of quantum well layers.

21. An optical device, comprising:

a first array of vertical cavity surface emitting lasers (VCSELs), said VCSELs of said first array having a long wavelength active medium interposed between a first mirror and a second mirror, said VCSELs of said first array emitting radiation at a first wavelength; and a second array of VCSELs integral with said first array of VCSELS, said VCSELs of said second array electrically pumped and emitting radiation at a second wavelength, said second wavelength shorter than said first wavelength, wherein said second array optically pumps said first array.

22. A method of stimulating emission in a first vertical cavity surface emitting laser (VCSEL) causing radiation at a first wavelength to be emitted by said first VCSEL, said method comprising injecting radiation into said first VCSEL at a second wavelength with a second VCSEL integral with said first VCSEL, said second wavelength shorter than said first wavelength.

* * * * *